United States Patent
Jones et al.

(10) Patent No.: US 11,556,679 B1
(45) Date of Patent: Jan. 17, 2023

(54) MODIFYING ELEMENTS IN A COMPUTER-AIDED DESIGN APPLICATION USING ENHANCED SELECTION FILTERING

(71) Applicant: Applied Software Technology, Inc., Atlanta, GA (US)

(72) Inventors: Chris Jones, Atlanta, GA (US); James Simpson, Atlanta, GA (US); Jason Faulkner, Atlanta, GA (US)

(73) Assignee: EVOLVE MEP, LLC, Atlanta, GA (US)

( * ) Notice: Subject to any disclaimer, the term of this patent is extended or adjusted under 35 U.S.C. 154(b) by 0 days.

(21) Appl. No.: 17/395,263

(22) Filed: Aug. 5, 2021

(51) Int. Cl.
    *G06F 30/12* (2020.01)
    *G06F 3/04847* (2022.01)
    *G06F 3/0482* (2013.01)

(52) U.S. Cl.
    CPC ............ *G06F 30/12* (2020.01); *G06F 3/0482* (2013.01); *G06F 3/04847* (2013.01)

(58) Field of Classification Search
    CPC .... G06F 30/12; G06F 3/0482; G06F 3/04847; G06F 30/13; G06F 30/17; G06F 30/20; G06F 9/451; G06N 5/025; G06Q 10/103; G06T 7/0014; G06T 17/10
    See application file for complete search history.

(56) References Cited

U.S. PATENT DOCUMENTS

| | | | | |
|---|---|---|---|---|
| 7,761,591 B2 * | 7/2010 | Graham | .................. | G06Q 40/02 709/227 |
| 8,594,410 B2 * | 11/2013 | Schmidt | ................ | G06T 7/0014 382/128 |
| 10,691,844 B2 * | 6/2020 | Lauer | ...................... | G06F 30/17 |
| 2021/0073449 A1 * | 3/2021 | Segev | .................... | G06N 5/025 |

FOREIGN PATENT DOCUMENTS

| | | | | | | |
|---|---|---|---|---|---|---|
| CN | 102804186 A | * | 11/2012 | ............. | G06F 9/451 |
| CN | 106354968 A | * | 1/2017 | ............. | G06F 30/13 |
| CN | 107016150 A | * | 8/2017 | ............. | G06F 30/20 |
| CN | 111095258 A | * | 5/2020 | ........... | G06Q 10/103 |
| CN | 112541207 A | * | 3/2021 | ............. | G06F 30/12 |
| EP | 1316051 B1 | * | 4/2004 | ............. | G06T 17/10 |
| WO | WO 2005098687 A1 | * | 10/2005 | ............. | G06F 17/50 |

OTHER PUBLICATIONS

U.S. 2021/0073449, see the short version, Mar. 2021.*
U.S. Pat. No. 8,594,410, see the short version, Nov. 2013.*

* cited by examiner

*Primary Examiner* — Kandasamy Thangavelu

(74) *Attorney, Agent, or Firm* — Clayton, McKay & Bailey, PC

(57) ABSTRACT

Examples can include a system for creating filters within a computer-aided design ("CAD") application and performing actions on elements that satisfy the filter criteria. A plugin can generate an element modification window that is displayed on a graphical user interface ("GUI"). The plugin can receive criteria for a first filter based on a tab that allows the user to select a parameter, operator, and operand. The user can categorize and edit the filters and select an action to perform on elements that fit the filter criteria. Such actions can include copying a parameter, modifying a parameter, executing a macro, and changing an element's associated work set. The plugin automatically perform the action on new and modified elements based on a user selection.

20 Claims, 10 Drawing Sheets

MODIFYING ELEMENTS IN A COMPUTER-AIDED DESIGN APPLICATION USING ENHANCED SELECTION FILTERING

BACKGROUND

Computer-aided design ("CAD") software allows users to design structures for construction, among other things. One type of CAD software is Building Information Modeling ("BIM") software, which allows users to elaborately design three-dimensional structures. AUTODESK REVIT is one type of BIM software that can be used to design complex buildings all the way down to components and assemblies for use in a project. For example, a user can model an entire plumbing or electrical installation within a building.

REVIT allows users to add elements, such as electrical assemblies, to a design layout that is displayed in a graphical user interface ("GUI"). Often, a user will want to change the parameter on a particular set of elements within a complex design layout. For example, a user will want to change a work set for a group of elements in a project. REVIT currently does not include this functionality. Instead, a user must modify the parameter of each element individually. This is both time consuming and likely to lead to elements in a design layout not having the correct parameters. For example, it may be impossible for a user to physically notice and change elements that need a parameter change. Users are often limited to using REVIT in many cases because of REVIT's widespread success.

As a result, a need exists for parameter modification in REVIT based on a granular selection of elements.

SUMMARY

The examples described herein specifically address technical problems and limitations of REVIT and similar BIM software. The examples include a computing device, such as a personal computer, tablet, or laptop, that executes a computer-aided design application such as REVIT. The application can include an application programming interface ("API") that interacts with a plugin that supplies additional functionality for auto-modifying elements. The plugin can include a selection filter engine that executes on the computing device.

A plugin can generate an element modification window that is displayed on a GUI. The element modification window can allow a user to create rules for actions to be performed on elements that satisfy criteria of a filter. For example, the plugin can receive criteria for a filter based on a window in the GUI that allows the user to select a parameter, operator, and operand. In one example, the plugin can receive a selection of an existing filter. The user can select an action to perform on elements that satisfy the filter criteria. The plugin can loop through elements in a library of the CAD application and automatically perform the selected action on elements that satisfy the filter criteria.

The element modification window can allow the user to select one of multiple actions from within the same window, or the plugin can provide different versions of the element modification window for different actions that are available. For example, the plugin can provide a parameter modification window for copying a parameter value from one parameter to another, a macro execution window for setting a macro to execute on certain elements, and a work set modification window changing a work set that certain elements correspond to. In one example, the parameter modification window can allow a user to input a PowerShell script to modify a data object parameter.

In an example, the element modification window can allow a user to enable or disable a rule or decide whether to have the rule run automatically or manually. The element modification window can include a manual execution button that the user can select to manually execute enabled rules. When the user selects to have a rule automatically applied, the plugin will detect when a new element is created or an existing element is modified in the CAD application. The plugin can run the element through the enabled filters. When the element satisfies the filter criteria, the plugin can automatically execute the corresponding action in the rule without any user action.

The examples summarized above can each be incorporated into a non-transitory, computer-readable medium having instructions that, when executed by a processor associated with a computing device, cause the processor to perform the stages described. Additionally, the example methods summarized above can each be implemented in a system including, for example, a memory storage and a computing device having a processor that executes instructions to carry out the stages described.

Although REVIT is referred to as an example, the systems and methods can operate with other CAD and BIM applications. These systems and methods can reduce the operational time required by a user, greatly enhance the user experience, and prevent the user from accidentally selecting items that they do not intend to select within the GUI.

Both the foregoing general description and the following detailed description are exemplary and explanatory only and are not restrictive of the examples, as claimed.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

Examples can include a system for creating filters within a CAD application and performing actions on elements that satisfy the filter criteria. A plugin can generate an element modification window that is displayed on a GUI. The plugin can receive criteria for a first filter based on a tab that allows the user to select a parameter, operator, and operand. The user can categorize and edit the filters and select an action to perform on elements that fit the filter criteria. Such actions can include copying a parameter, modifying a parameter, executing a macro, and changing an element's associated work set. The plugin automatically perform the action on new and modified elements based on a user selection.

Figure 1:
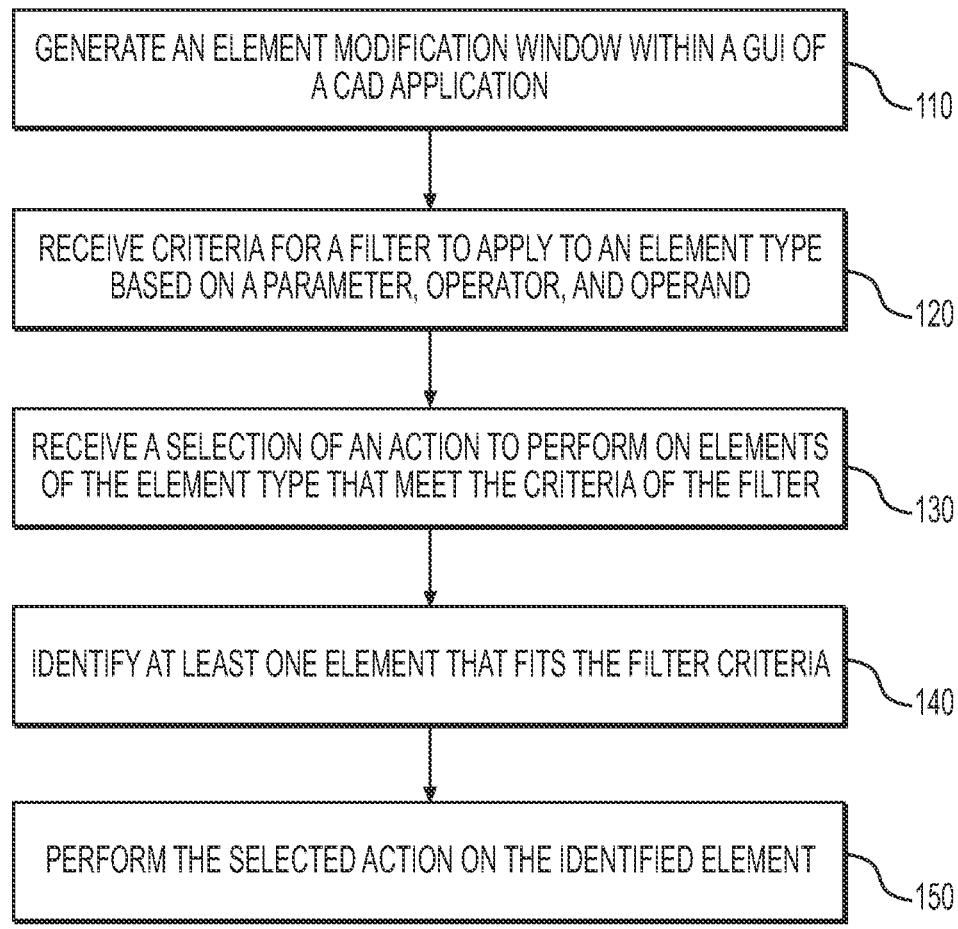
FIG. 1 is a flowchart of an example method for modifying elements in a CAD application using enhanced selection filtering.

FIG. 1 is a flowchart of an example method for modifying elements in a CAD application using enhanced selection filtering. At stage 110, the plugin can generate an element modification window within REVIT. The plugin can run as part of REVIT, providing additional functionality in an example. The functionality can include a selection engine, which can be responsible for generating the element modification window, saving filters and rules, and applying filters and rules to elements in a design layout of REVIT. The selection engine can be part of the CAD application in an example. Alternatively, the selection engine can be supplied by a plugin that operates with the CAD application.

The element modification window can include features for performing actions on elements, such as modifying element parameters and executing a macro. For example, the element modification window can include multiple tabs for selecting or creating a filter to identify elements and choosing an action to perform on the identified elements. A filter can have user-defined criteria. The user can save the selection filter in a library. Then the user can enable one or more of the saved selection filters to apply an action to. The user can also select what action to element that fit the criteria of the filter.

The selection engine of the GUI can generate the element modification window sand some features of the selection tool. For example, the plugin can interact with the CAD application, such as REVIT, through API calls. This can cause the GUI of the CAD application to display custom buttons and menu items. For example, a special selection tool can be activated with one such button. Additionally, the plugin can cause the GUI to display buttons or menu items for viewing the element modification window for purposes of performing specific actions on elements that fit the filter criteria. In one example, the plugin can cause the GUI to display a different button for each type of action that can be performed, and selection of a button can cause the GUI to display an element modification window specific to the selected action. For example, the plugin can cause the GUI to display a button for a modifying an element parameter, executing a macro, and setting a work set parameter.

In one example, the user can create a new filter or search for an existing filter that is already saved in a filter library. Either can involve the entry of criteria for a filter into the element modification window at stage 120. The criteria can include one or more conditions that specify which types of parts should be modified. Each condition can include a parameter, operator, and operand. The parameter can be any attribute of an element (e.g., part) within the GUI. The plugin can retrieve a list of all elements and all attributes of those elements, in an example, based on API interactions with the CAD application. The attributes can then populate a dropdown that the user can select for a criterion (i.e., condition). For example, parameters can include diameter, length, width, part types, and others.

The user can select one or more parameters that the filter will use. For purposes of filter search, these selected parameters can be compared against existing stored filters in a library. The user can select an existing filter, create a new filter, or modify and save an existing filter as a new filter.

In one example, part types are specified on a separate tab of the element modification window, such as a categories tab. The categories tab can include a hierarchical tree of all the part types present within the GUI. The plugin can make API calls to REVIT to retrieve the present part types, in an example. Those can be displayed for selection in a nested tree, such that an assembly is displayed with an arrow for possible expansion. The user can then select the types of parts that should be modified. For example, the user may want to select ducts and pipes with a diameter greater than two inches. A filter can be created with duct and pipe part types as parameters.

The user can similarly select an operator and operand for the parameter. For example, the operator can be "greater than" and the operand can be two inches. The example filter for ducts and pipes with a diameter greater than two inches can include a diameter attribute parameter with an operator of greater than with an operator of two inches. The parameter for duct and pipe part types can be either part of the diameter parameter or separate. For example, Boolean operators for duct and pipe part types can be included.

At stage 130, the plugin can receive a selection of an action to perform on elements of the element type that meet the criteria on the filter. In an example, the GUI can include a button for each type of action that can be performed by the plugin. For example, the plugin can provide functionality for the CAD application to perform a parameter sync, execute a macro, or move one or more elements from one work set to another. The GUI can include a button for each action type that, when selected, launches an element modification window specific to the selected action.

In an example, parameter sync can include copying a parameter value from one element parameter to another. For example, the element modification window can include a tab for selecting a parameter to copy from and another tab for selecting a parameter to copy to. In one example, the available options for these tabs can be based on the filter criteria provided at stage 120. For example, a user can select or define an element type, and the element modification window can populate a list of parameters from the elements that fit the criteria.

In an example, the parameter sync element modification window can include a tab for modifying the parameter value being copied. In one example, the element modification window can populate a list of available modifications that the user can choose from. In one example, a user can select a field or button under the tab that opens a text window. The user can enter a script into the window for modifying the parameter value. As an example, the parameter values can be data objects that can be modified by a PowerShell script. The user can enter a PowerShell script into the text window that the plugin can execute when copying the parameter value. This can allow a user to customize the copied parameter value.

In an example, an element modification window for macro execution can cause the plugin to execute a macro on the elements that fit the filter criteria. In one example, the element modification window can include a tab where a user can select a macro to execute. For example, the tab can include a drop-down menu where the user can select a macro. The macro can then be executed on all elements that fit the selected criteria.

In an example, the plugin can provide an option to change a work set that elements are associated with. This option can be provided in an element modification window or a window specific for changing work sets, depending on the example. The user can enter filter criteria for identifying elements that will be moved from one work set to another. The user can also identify the work set to move the filtered elements to. For example, the element modification window can include a drop-down list of work sets that the filtered elements can be transferred to.

At stage 140, the plugin can identify at least one element that fits the filter criteria in the design layout. For example, the plugin can run a search on all the element types in the design layout and determine which elements meet the criteria of the filter. To do this, the selection engine can receive the list of elements selected in the display layout. Then, looping through the elements, the selection engine can compare each to the criteria of the filter. For each condition of the filter, the selection engine can request the parameter value of the element being compared. This can include making an API call to REVIT (or other CAD applications). Alternatively, the selection engine can retrieve the value from the element, such as when that value has already been supplied by REVIT. When the condition is a comparison to another element, the plugin can retrieve the relevant value of that comparison element with an API call to REVIT.

The selection engine can compare the value against the operand for the condition, using the operator. If the conditions are met, the element is included in the set of selected elements. Otherwise, the selection engine can deselect the element in an example. For the purposes of this disclosure, deselection can include simply not selecting those elements in the first place based on applying the selection filter as part of the selection process. In this way, deselection can be synonymous with a lack of selection. For example, if the element does not meet the criteria of the filter, it may never be included in the list of selected elements in an example. Alternatively, the deselection can include removing the element from the set of selected elements. This can occur in scenarios where the filter is applied by the selection engine after the set of elements has already been selected. For example, the user might click a button to apply the filter to a selection that they have already made on the GUI. Alternatively, the selection filter of some examples receives the selected set of elements as part of selection and removes from the set those elements that do not meet the filter criteria. To deselect the element, the selection engine can make an API call to REVIT for deselection, identifying the element.

The selection engine can continue this process through all of the elements in the design layout, applying all of the criteria of the selected filter(s). This can include looping through a list of elements that fall within the selection box or that have already been selected and are part of the set of selected elements.

At stage 150, the plugin can perform the selected action on the at least one element. The selected action can be applied to each element that satisfies the criteria. In one example, the element modification window can include a selectable button where the user can choose where or not to perform the action. For example, the user can pause or unpause a rule. In another example, the element modification window can allow the user to select a button for automatically applying the rule. This can cause the plugin to run filter for any new or modified element. If the new or modified element satisfies the filter criteria, the plugin can perform the associated action.

In an example, the element modification window can include a button that allows the user to choose whether to apply the selected action to new elements created in a design layout of the CAD application. For example, if the user enables this feature, the plugin can create a rule for newly created elements in the design layout. Whenever a new element is created in the design layout, the plugin can run it through the filter for the rule. If the new element meets the criteria for the filter, the plugin can then execute the corresponding action.

As an example, a user can be designing components of the first floor of a building in REVIT in a work set for the first floor. The user has certain components that need to be associated with the second floor, which is in a second-floor work set. Normally, the user would have to manually assign each such component to the second-floor work set. However, with the plugin, the user can create a rule that identifies each component that should be associated with the second-floor work set and automatically changes it to that work set. As an example, the user can create a filter that identifies any conduit part with the text "#2F" in a name field. The user can put the text "#2F" into each piece of conduit that should be in the second-floor work set. As the user creates and modifies elements for these second-floor conduit components, the plugin can run the filter to detect these elements, and automatically change their work set parameter to the second-floor work set.

In an example, the element modification window can include a button for manually executing a rule. For example, executing a rule may take a significant amount of time, and the user can choose to not execute the rule until the user does not need to use REVIT. When the user is ready, the user can select the manual executing button to execute the rule. In an example, the user can create multiple rules, and the element modification window can allow the user enable or disable each rule and select or deselect automatic execution of each rule. When the user selects the manual execution button, the plugin can execute each enabled rule.

In an example, the element modification window can include an option for the plugin owner to create rules that cannot be disabled by a user. For example, a plugin owner user can create a rule and select a button that prohibits a user, such as a client user, from disabling executing of the rule. In one example, such rules can be displayed in the element modification window so that users can see the rule. This can help save time and resources in reconfiguring and releasing the plugin to users. For example, the plugin owner can quickly create a rule for modifying certain parameters without having to modify any code of the plugin.

Figure 2:
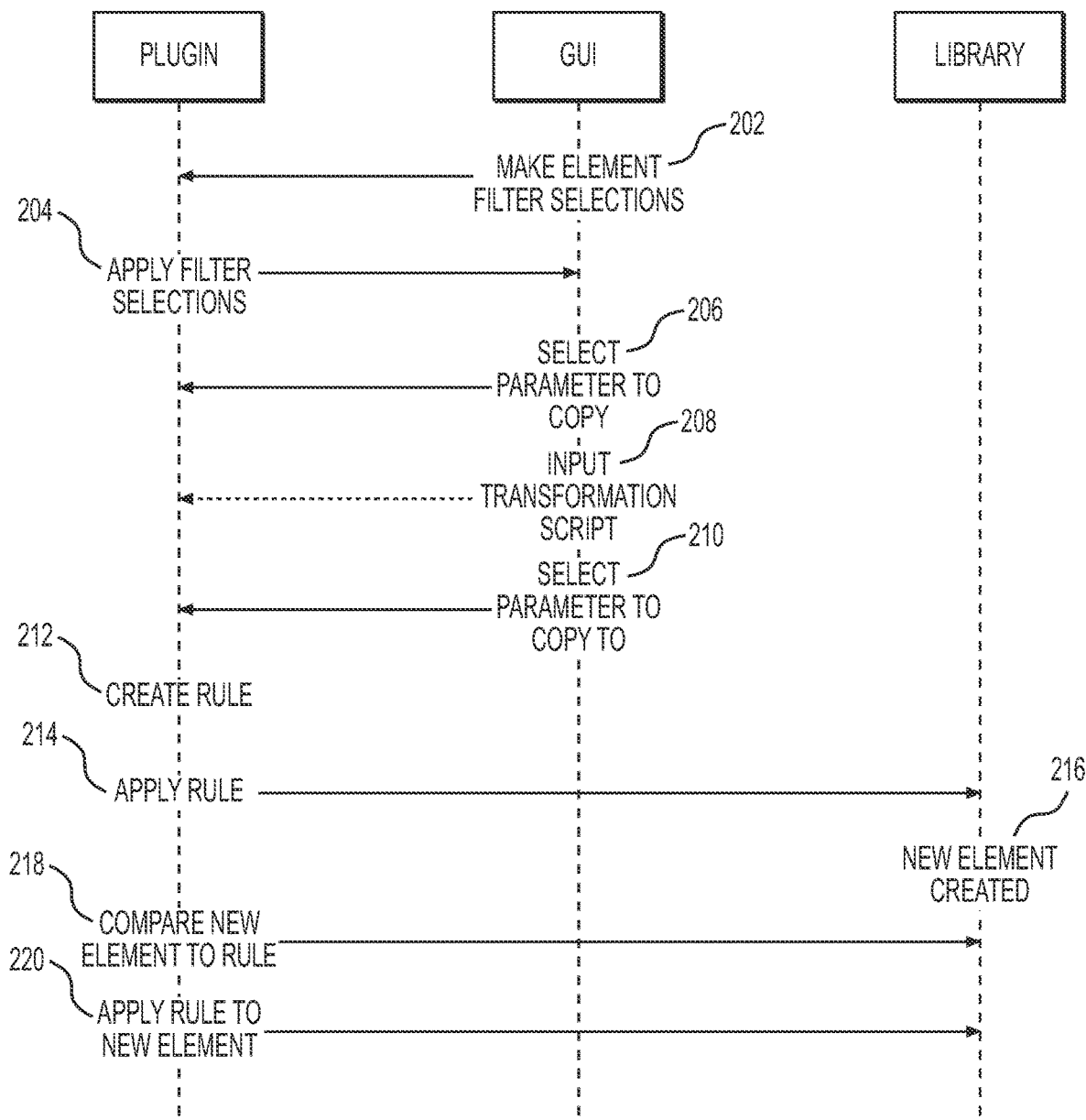
FIG. 2 is a sequence diagram of an example method for modifying parameters of elements in a CAD application using enhanced selection filtering.

FIG. 2 is a sequence diagram of an example method for modifying parameters of elements in a CAD application using enhanced selection filtering. At stage 202, a user can make element filter selections in a GUI. For example, the user can click on a button in the GUI of the CAD application that opens an element modification window. In the element modification window, the user can create a new filter or select a filter that is already saved in a library. The user can also select an action to perform on elements that meet the filter's criteria. The user can select one or more criteria that the filter will use.

At stage 204, the plugin can apply the filter selections to the GUI. In one example, this can include populating one or more lists of parameters from elements that fit the filter criteria. For example, the plugin can populate a first list of parameters for copying from and a second list of parameters for copying to. In one example, the user can create a different filter for each list.

At stage 206, a user can select a parameter to copy in the GUI. In one example, the user can select a parameter from a list. In another example, the user can input text into a field, and the plugin can automatically populate a list of available parameters as the user types. The user can select one of the parameters from the list. In one example, the user can input or select a parameter and add alphanumeric text in the field after the parameter. The plugin can copy the parameter and insert the extra text into the parameter when it copies the parameter over.

At stage 208, the user can optionally input a transformation script into the GUI. For example, the user can select a button or field in the element modification window that opens a window for modifying the parameter value. The user can enter a script into the window that the plugin can include when executing the rule to modify the parameter. For example, the parameters can be data objects, such as a PowerShell data object. The script can cause the plugin to perform a data object transformation on parameter that modifies it when copying it to the other parameter.

At stage 210, the user can select a parameter to copy to in the GUI. This can include selecting the parameter from a list populated by the plugin, inputting the name of the parameter, or selecting the parameter from a list populated based on a partial name inputted by the user, depending on the example.

At stage 212, the plugin can create a rule based on the input received. In an example, the rule can include the filter criteria and the action to be performed on elements that meet the criteria. In one example, the rule can include a setting for when to apply the rule. For example, the element modification window can include options for enabling the rule and automatically applying the rule. The enable option can turn the rule on and off. The automatic option, when enabled, can cause the plugin to apply the rule to elements as they are created or modified. The element modification window can also include a manual execution button that, when selected, executes enabled rules that are not set to automatically execute.

At stage 214, the plugin can apply the rule to existing elements in the library. For example, the plugin can apply the filter to identify elements in the library that fit the criteria. The plugin can copy the parameter selected by the user and apply any modification provided by the user. The plugin can input the copied parameter with any modifications into the parameter selected by the user in the elements that fit the filter criteria.

At stage 216, the user can create a new element in the CAD application. In one example, a new element can be a modified element. For example, the plugin can detect when a user creates a new element or modifies an existing element. When this occurs, the plugin can compare the new or modified element to the rule at stage 218. For example, the plugin can determine whether the new or modified element satisfies the filter criteria. If not, the plugin can take no further action. If so, the plugin can apply the rule to the new element at stage 220. For example, the plugin can copy the parameter selected at stage 206 to the parameter selected at stage 210 for the new or modified element.

In an example of the method described above, the element modification window can allow a user to set a rule for changing a work set parameter of certain elements. For example, rather than copying a parameter from one element to another, the GUI can allow the user to select a work set. The user can create criteria for elements to apply the rule to. For elements that fit the criteria, the plugin can change the work set parameter to the selected work set.

Figure 3:
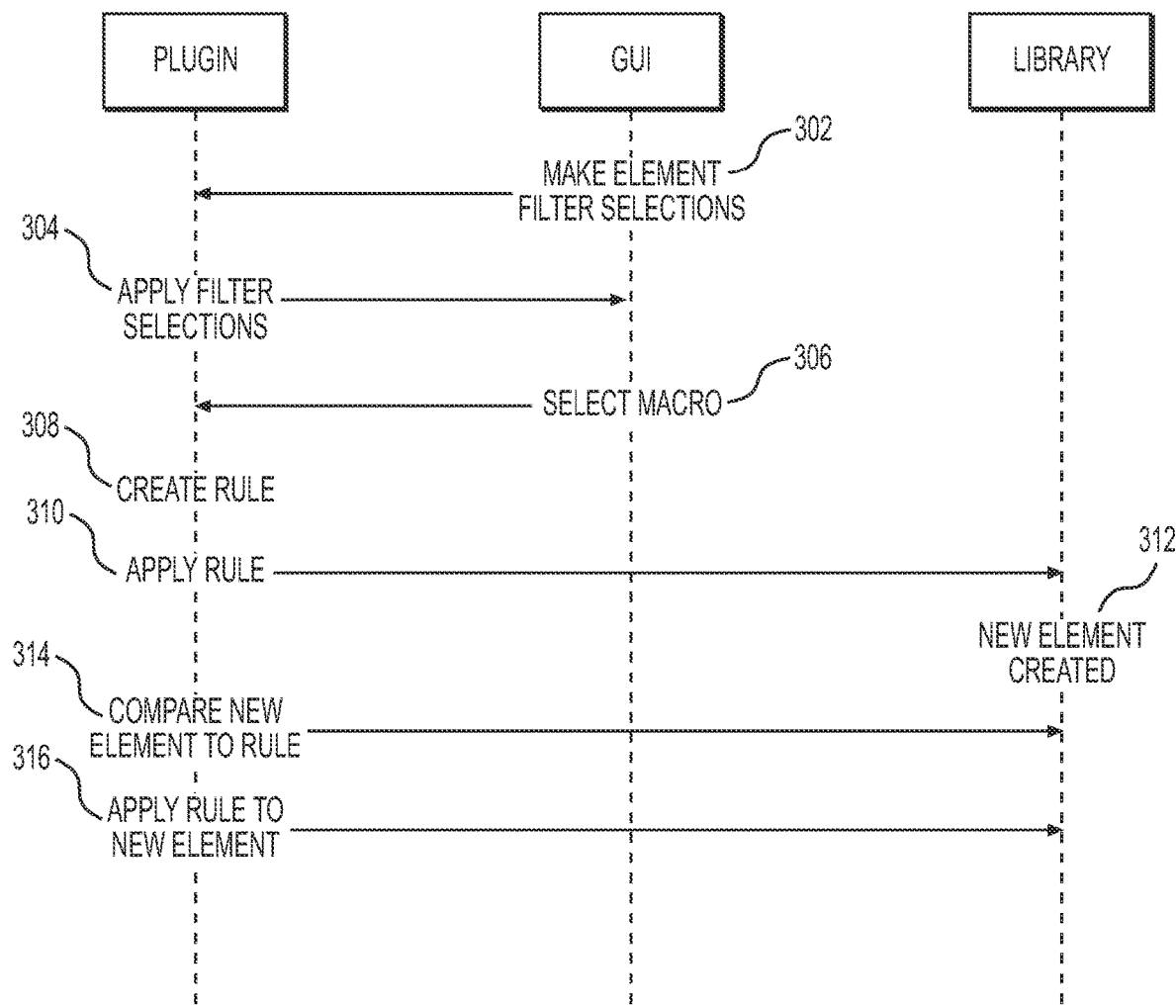
FIG. 3 is another sequence diagram of an example method for executing a macro on elements in a CAD application using enhanced selection filtering.

FIG. 3 is another sequence diagram of an example method for executing a macro on elements in a CAD application using enhanced selection filtering. At stage 302, a user can make element filter selections in a GUI. For example, the user can click on a button in the GUI of the CAD application that opens an element modification window. In the element modification window, the user can create a new filter or select a filter that is already saved in a library. The user can also select an action to perform on elements that meet the filter's criteria. The user can select one or more criteria that the filter will use.

At stage 304, the plugin can apply the filter selections to the GUI. Depending on the example, the plugin can populate a list of elements or parameters based on the user's selections. For example, the user can create a filter for all pipes longer than five feet or conduit made of a certain material. The plugin can retrieve any macros that are available to execute on the elements that fit the criteria. In one example, the plugin can populate a list of these macros in the element modification window.

At stage 306, the user can select a macro. For example, the names of available macros can be provided in a drop-down list in the element modification window and the user can select from the menu. In one example, the user can enter the name of the macro into a text field. Alternatively, the plugin can populate a list of available macros that include input provided by the user as the user inputs the name.

At stage 308, the plugin can create a rule based on the selected macro. In an example, the rule can include the filter criteria and the macro to be executed. In one example, the rule can a setting for when to apply the rule. For example, the element modification window can include options for enabling the rule and automatically applying the rule. The enable option can turn the rule on and off. The automatic option, when enabled, can cause the plugin to execute the macro on elements as they are created or modified. The element modification window can also include a manual execution button that, when selected, executes enabled rules that are not set to automatically execute. At stage 310, the plugin can execute the macro on elements in the library that fit the filter criteria.

At stage 312, the user can create a new element in the CAD application. In one example, a new element can be a modified element. For example, the plugin can detect when a user creates a new element or modifies an existing element. When this occurs, at stage 314, the plugin can compare the new or modified element to the rule. For example, the plugin can determine whether the new or modified element satisfies the filter criteria. If not, the plugin can take no further action. If so, the plugin can execute the macro on the element at stage 316.

Figure 4A:
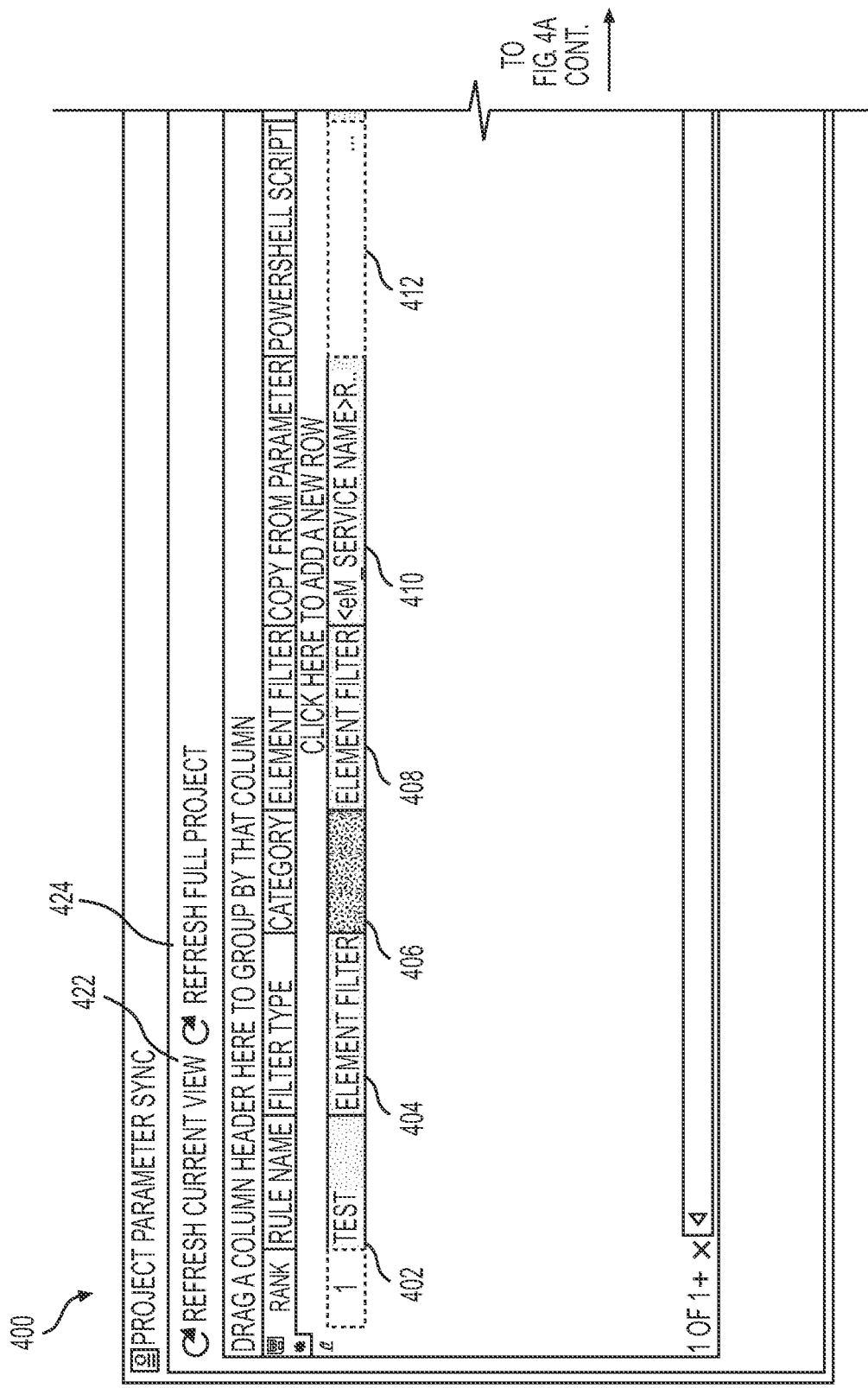
FIG. 4A is an illustration of an example GUI of a display used to modify parameters in a CAD application.
Figure 4A:
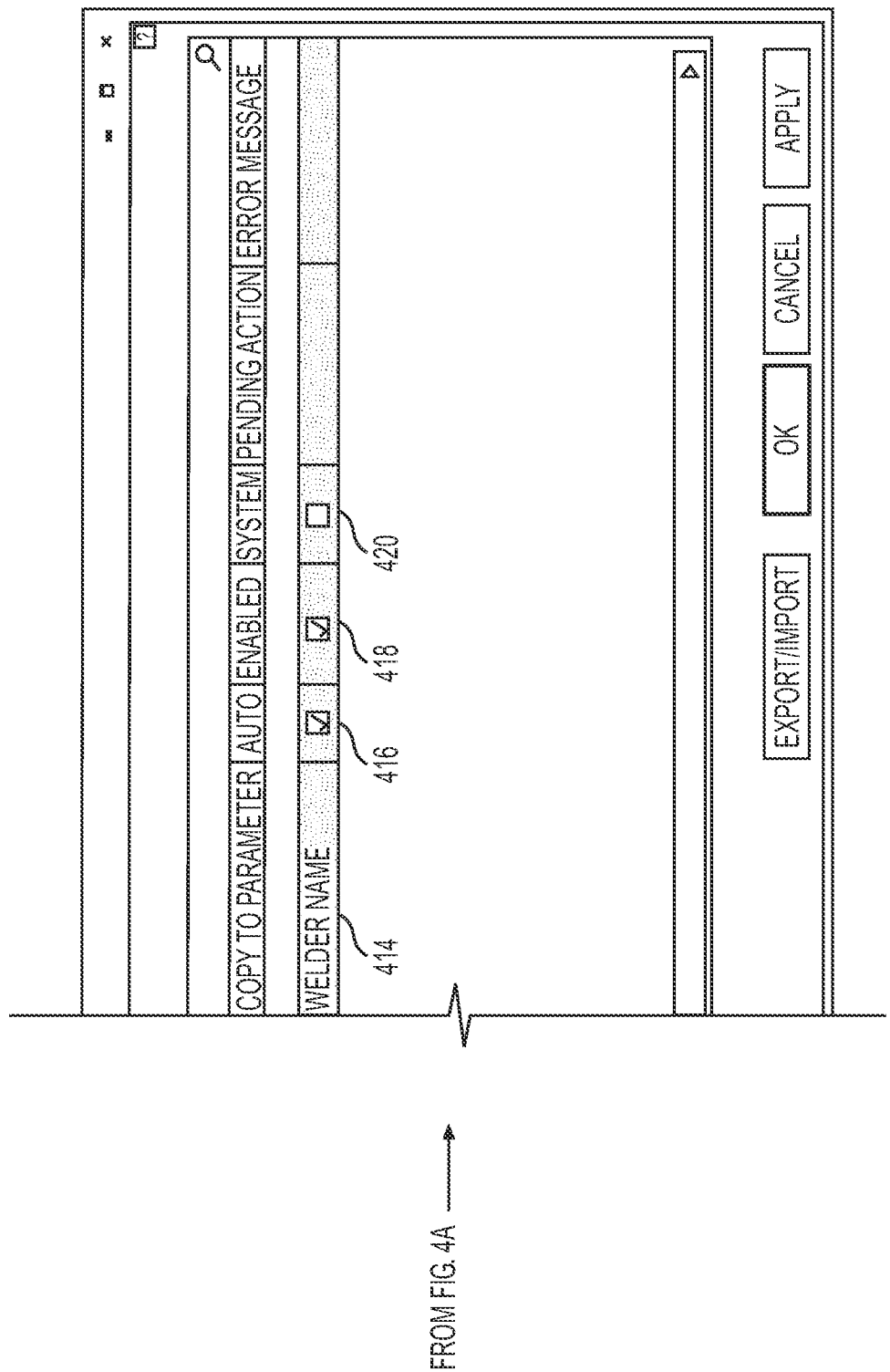

FIG. 4A is an illustration of an example parameter modification window 400 for modifying parameters. In an example, the parameter modification window 400 can be a type of element modification window discussed previously. A user can create rules for modifying element parameters using the parameter modification window 400. The user can name a rule in the rule name column 402. In one example, a user can select a field in the rule name column 402, such as with a tap or a click. A text box can appear, and the user can input the name of the rule.

A filter type dropdown 404 can allow the user to select what type of filter will be applied for the rule. A selection in the filter type dropdown 404 can cause the plugin to prefilter other columns in the parameter modification window 400. For example, the filter type dropdown 404 can include options for a category filter type and an element filter type.

Selecting a category filter type can activate the category column 406. The plugin can populate a list of categories in a dropdown list in the category column 406 or launch a window where the user can select which types of elements the filter applies to, depending on the example. Where a category window is displayed, element types to which the filter can apply are organized according to category, then sub-category. The user can select the types of elements to which the filter applies by marking boxes in the tree structure. For example, plumbing can be a category, with pipes and fittings as two sub-categories, and with different types of pipes as a sub-category of the pipes sub-category. With this sort of tree structure, the user can easily create filters that are as broad or narrow as needed. Alternatively, the user can select certain types of elements to blacklist or whitelist.

In an example, choosing the element filter type at the filter type column 404 can activate the element filter column 408. In one example, the user can type the name of an existing filter into a field in the element filter column 408. In another example, the plugin can populate a list of filters based on text entered by the user, and the user can select the filter from the list when it appears.

Figure 4B:
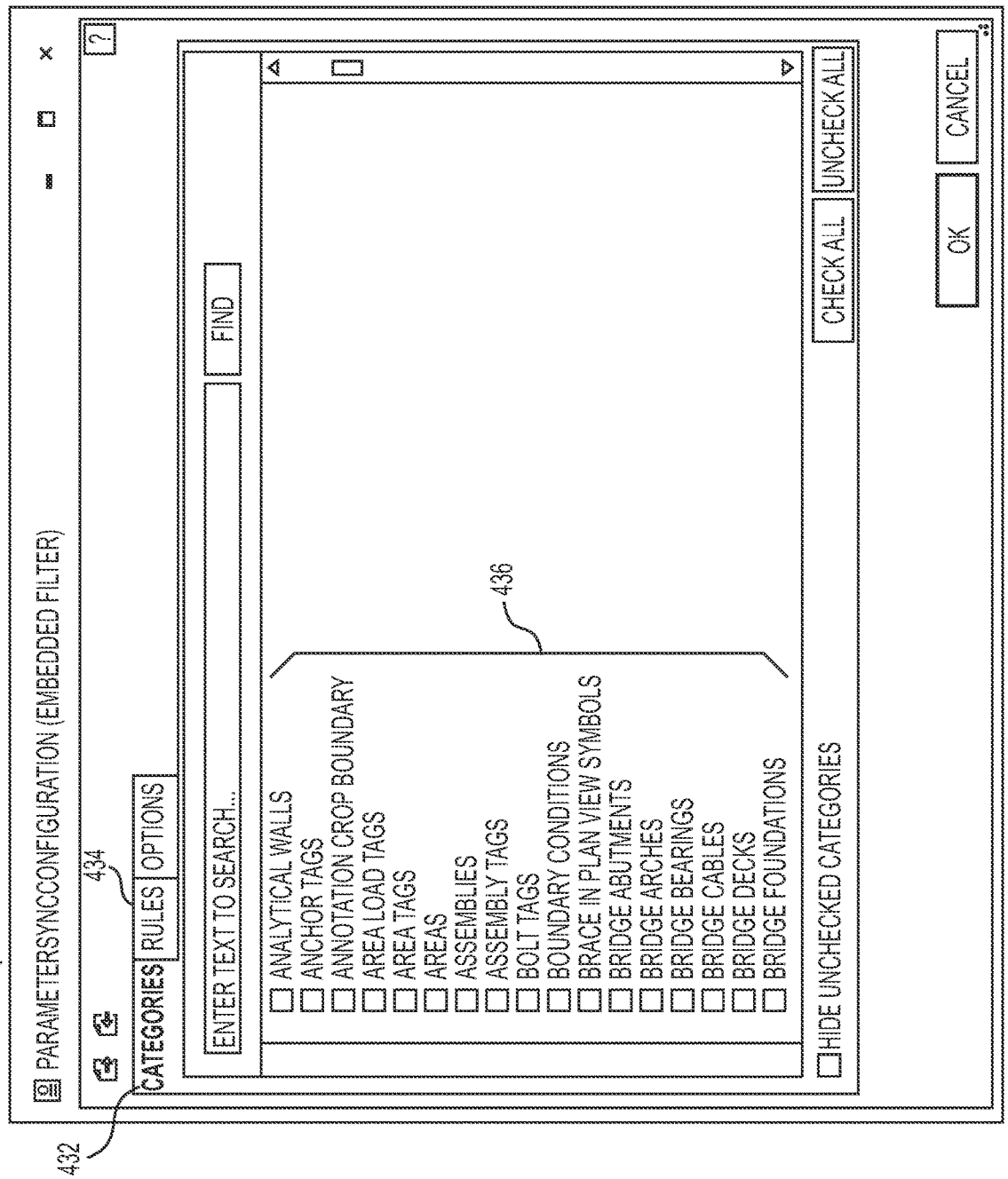
FIG. 4B is an illustration of an example GUI of a display for modifying filter settings.
Figure 4C:
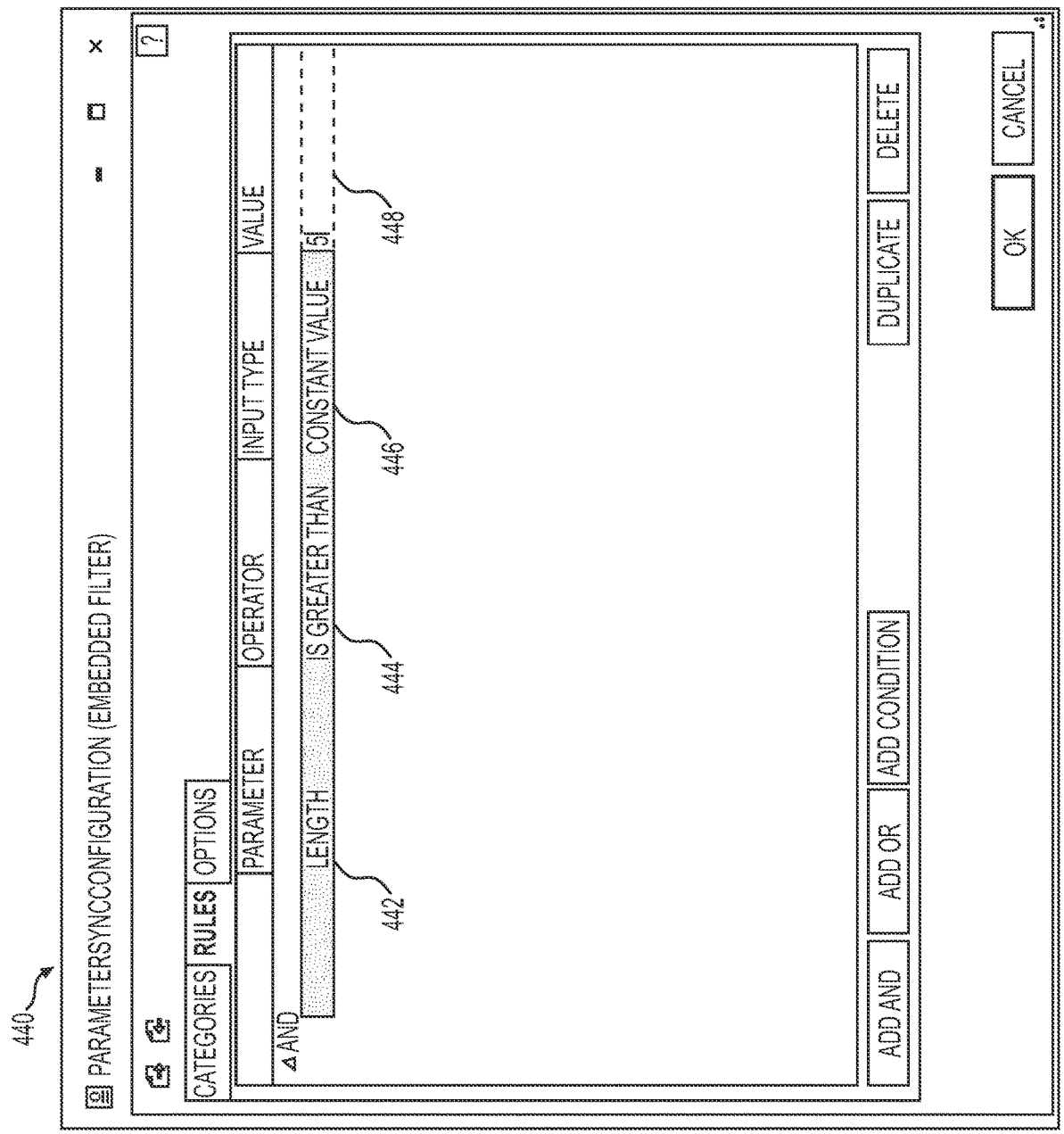
FIG. 4C is an illustration of a second example GUI of a display for modifying filter settings.

Moving temporarily to FIGS. 4A and 4B, when the user selects an element filter type, the plugin can launch an element filter selection window 430. The element filter selection window 430 can include a categories tab 432 and a rules tab 434. Under the categories tab 432, shown in FIG. 4B, the plugin can populate a selectable category list 436. The user can select any of the categories listed for the filter to apply to. The user can select the rules tab 434 to further customize the filter. Under the rules tab 434, shown in FIG. 4C, the user can set one or more parameters 442, operators 444, input types 446, and values 448. The resulting filter will include all elements in the selected categories that also satisfy the rules. As an example, the user can selectable a "pipework" category in the categories tab 432, and in the rules tab 434 the user can select a "length" parameter, a "greater than" operator, a "constant value" input type, and a value of five. This would create a filter that includes all pipes that are greater than five feet.

Returning to FIG. 4A, the parameter modification window 400 can include a copy from column 410. In the copy from column 410, the user can select a parameter to copy to another parameter. In one example, the plugin can populate a list of parameters from elements that fit the filter criteria. The plugin can insert the parameters into a drop-down list in the copy from column 410. The user can the select a parameter from the list to copy from. In one example, the parameter modification window 400 can allow the user to input additional text in the field with the parameter name, and that text can be copied over as well. For example, a user can select the parameter "em_Service Name", which can cause the plugin to display "<em_Service Name>" in the corresponding field in the copy from column 410. When copying the parameter, the plugin can identify the parameter by the text in between the "<" and ">" symbols. The user can then add additional text outside the "<" and ">" symbols, such as by adding "copied" afterward. The plugin can then copy the value of the "em_Service Name" parameter and append "copied" when writing it to the parameter being copied to. For example, if the "em_Service Name" value is "Service 1," and the user adds "copied" in the field, the plugin would write "Service 1 copied" to the receiving parameter.

The parameter modification window 400 can also include a PowerShell script column 412 that allows a user to enter a PowerShell script for further modifying the parameter being copied. For example, the parameter can be a data object, and selecting the field in the PowerShell script column 412 can cause the plugin to display a text window where the user can enter a PowerShell script. When the plugin copies the parameter over, it can also execute the PowerShell script, further modifying the parameter. The user can select the parameter receiving the copied parameter value at the copy to column 414.

The parameter modification window 400 can include an auto execution column 416, which can provide a selectable button or checkbox that the user can select. Doing so can cause the plugin to execute the copy action for the rule any time a new element is created or an existing element is modified in the CAD application. For example, when "auto" is enabled, the plugin can run any new or modified elements through the filter. If the element satisfies the filter criteria, the plugin can execute the parameter copy operation. Where "auto" is disabled, the plugin can only execute the rule manually by the user. For example, the parameter modification window 400 can include a refresh current view button 422 button and a refresh full project button 424. The user can select either of these buttons 422, 424 to execute all enabled rules. Rules can be enabled or disabled in the enabled column 418 by selecting or deselecting the box. Selecting the current view button 422 can cause the plugin to execute enabled rules only for the current view, and selecting the refresh full project button 424 can cause the plugin to execute all enabled rules for the entire project.

The parameter modification window 400 can include a system column 420. In an example, this can be an option for adding and administratively enabling or disabling a rule by the plugin owner. This can save time and resources that would otherwise need to be spent writing new code into the plugin and releasing an update to clients. For example, instead of having to code a rule into the plugin, an administrator user can create a rule and select the box in the system column 420 to enable the rule. When the system box is checked, client users can be prevented from disabling or modifying the rule. This can allow the plugin owner to make needed changes to parameters quickly so that they can be coded and released later on.

Figure 5:
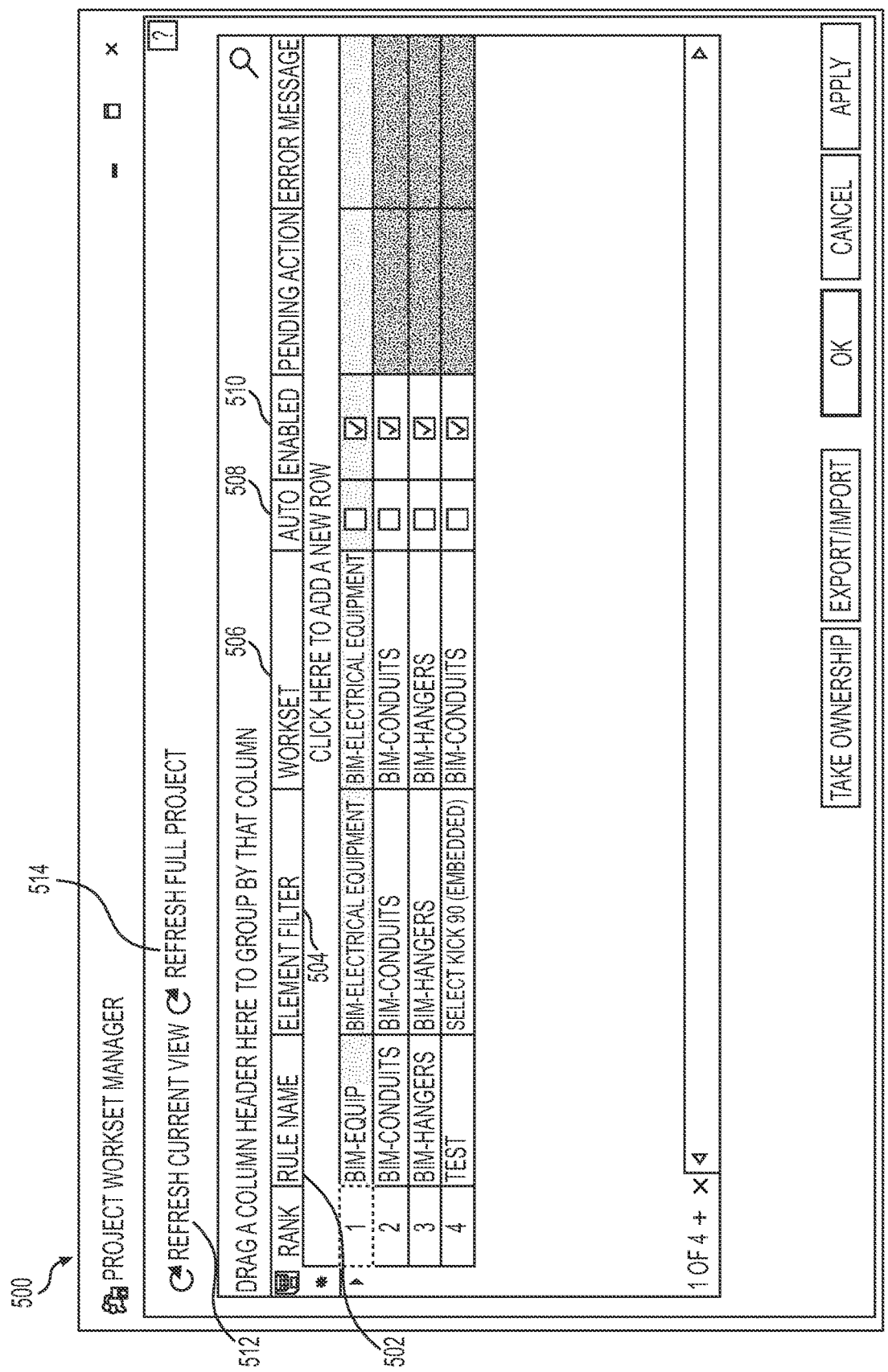
FIG. 5 is an illustration of a second example GUI for modifying work set settings of elements in a CAD application.

FIG. 5 is an illustration of an example work set modification window 500 for moving elements from one work set in the CAD application to another. In an example, the work set modification window 500 can be a type of element modification window discussed previously. The work set modification window 500 can include a rule name column 502 that allows the user to create a name for the rule. The work set modification window 500 can also include an element filter column 504 that allows the user to create a filter to apply to the rule. In an example, the user can type the name of an existing filter into a field in the element filter column 504. In another example, the plugin can populate a list of filters based on text entered by the user, and the user can select the filter from the list when it appears. In one example, when the user selects a field in the element filter column 504, the plugin can launch an element filter selection window, such as the element filter selection window 430 discussed above. The user can use the element filter selection window 430 to create a new filter for the rule.

The work set modification window 500 can include a work set column 506. In the work set column 506, the plugin can populate a list of work sets available in the CAD application. The work set column 506 can include a drop-down list of the available work sets that the user can choose from. In one example, the user can enter the name of the work set, such as by typing in the name. When the rule is executed, the plugin can change a work set parameter for all elements in the filter to the work set identified in the work set column 506, which can move the elements to the selected work set.

Like the parameter modification window 400 described previously, the work set modification window 500 can also include an auto execution column 508 (corresponding to the auto execution column 416) and an enabled column 510 (corresponding to the enabled column 418). The auto execution column 508 can allow a user to select whether to have the plugin execute the work set change any time a new element is created or an existing element is modified in the CAD application. The user can enable or disable the rule entirely in the enabled column 510. In one example, where the auto execution setting is disabled and the enabled setting is enabled, the user must select the refresh current view button 512 button and a refresh full project button 514, which can function like the refresh current view button 422 and refresh full project button 424 in FIG. 4, respectively. For example, selecting the current view button 512 can cause the plugin to execute enabled rules only for the current view, and selecting the refresh full project button 514 can cause the plugin to execute all enabled rules for the entire project. Where the enabled column 510 is disabled for a rule, the plugin will not execute automatically or manually.

As an example, a user can be designing components of the first floor of a building in REVIT in a work set for the first floor. The user has certain components that need to be associated with the second floor, which is in a second-floor work set. REVIT currently does not have the functionality to allow a user to do this without manually assigning each such component to the second-floor work set. However, using the work set modification window 500, the user can create a rule that identifies each component that should be associated with the second-floor work set and automatically changes it to that work set. As an example, the user can create a filter using the element filter column 504 that identifies any conduit part with the text "#2F" in a name field. In the work set column 506, the user can select a work set associated with the second floor of the project. The user can enable the rule in the enabled column 510 and turn on the auto setting in the auto execution column 508. The user can input the text "#2F" into each piece of conduit that should be in the second-floor work set. As the user creates and modifies elements for these second-floor conduit components, the plugin can run the filter to detect these elements, and automatically change their work set parameter to the second-floor work set. If a user forgets to input "2F" into the name parameter of an element, the plugin will not change the work set for that element. However, the user can go back and edit the name to include the "2F," which the plugin will detect, causing it to run the element through the rule again, this time causing it to change the work set to the second floor.

Figure 6:
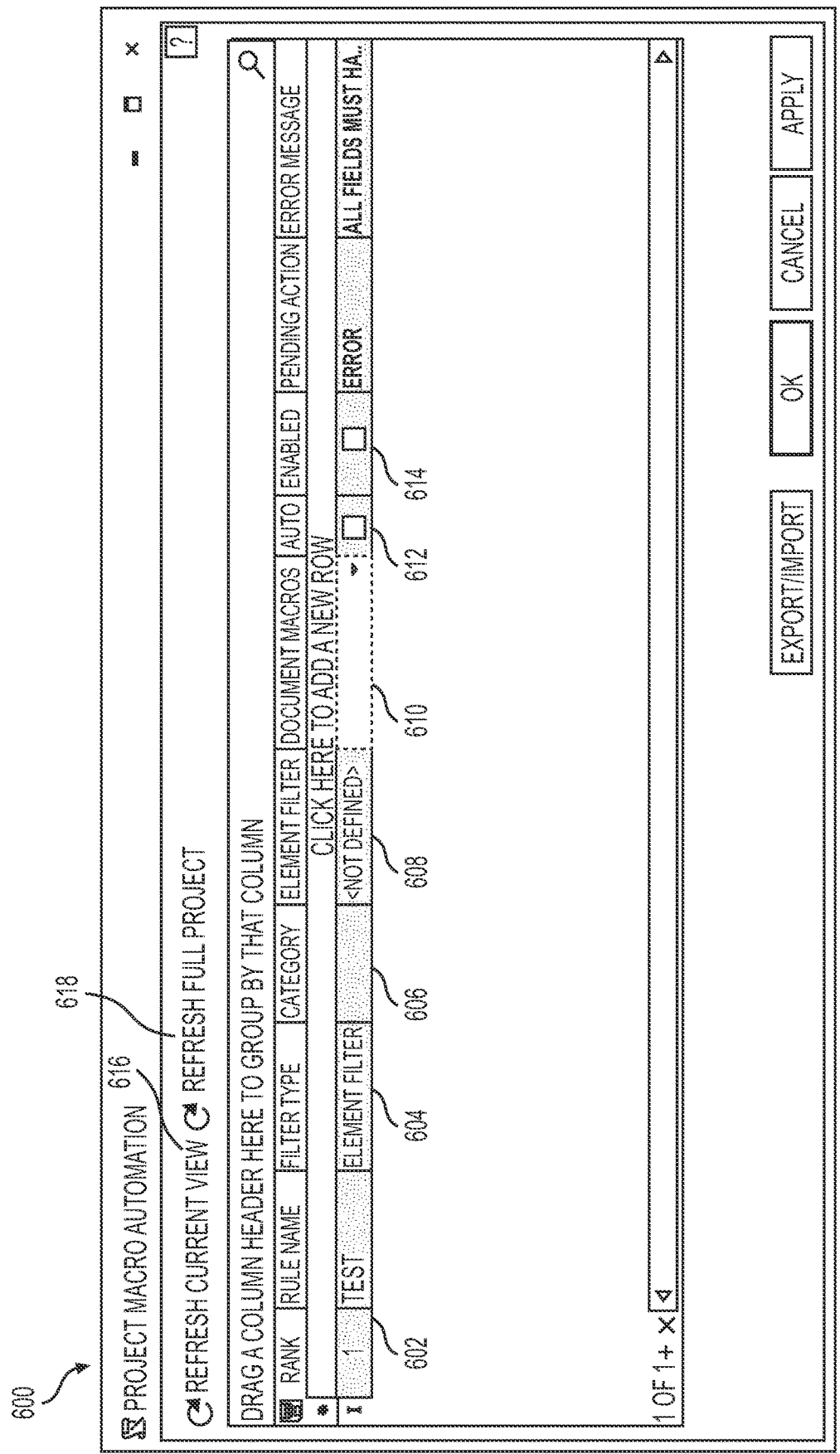
FIG. 6 is an illustration of a third example GUI for executing a macro on elements in a CAD application.

FIG. 6 is an illustration of an example macro modification window 600 for creating rules that cause the plugin to execute a macro on elements that satisfy filter criteria. In an example, the macro modification window 600 can be a type of element modification window discussed previously. The macro modification window 600 can include a rule name column 602 that allows the user to create a name for the rule. Like the parameter modification window 400 described previously, the macro modification window 600 can include a filter type dropdown 604 that allows the user to select a type of filter to apply, such as a category or element type filter. A selection in the filter type dropdown 604 can cause the plugin to prefilter other columns in the parameter modification window 400. Selecting a category filter can cause the category column 606 to activate, and selecting an element type filter can cause the element filter column 608 to activate.

For a category filter, the plugin can populate a list of categories in a dropdown list in the category column 606 or launch a window where the user can select which types of elements the filter applies to, depending on the example. Where a category window is displayed, element types to which the filter can apply are organized according to category, then sub-category. The user can select the types of elements to which the filter applies by marking boxes in the tree structure.

For an element type filter, the user can type the name of an existing filter into a field in the element filter column 608. In another example, the plugin can populate a list of filters based on text entered by the user, and the user can select the filter from the list when it appears. In another example, the user can create or customize a filter using an element filter selection window like the element filter selection window 430.

In an example, after the user designates a filter, the plugin can populate a list of macros that can be executed in the document macros column 610. The document macros column 610 can include a dropdown of the available macros that the user can choose from. The macros can be preconfigured in the plugin, provided by another plugin, inputted by the user using the document macros column, or provided by other similar means, depending on the example. The user can also select whether to have the rule automatically run for new and modified elements using the auto execution column 612. The user can also enable or disable the rule using the enabled column 614. Like the GUI windows described previously, the macro modification window 600 can also include a refresh current view button 616 and a refresh full project button 618 that allows the user to manually run rules for macros. When the plugin executes the rule, the plugin will identify elements that satisfy the filter criteria and execute the macro selected in the rule.

Figure 7:
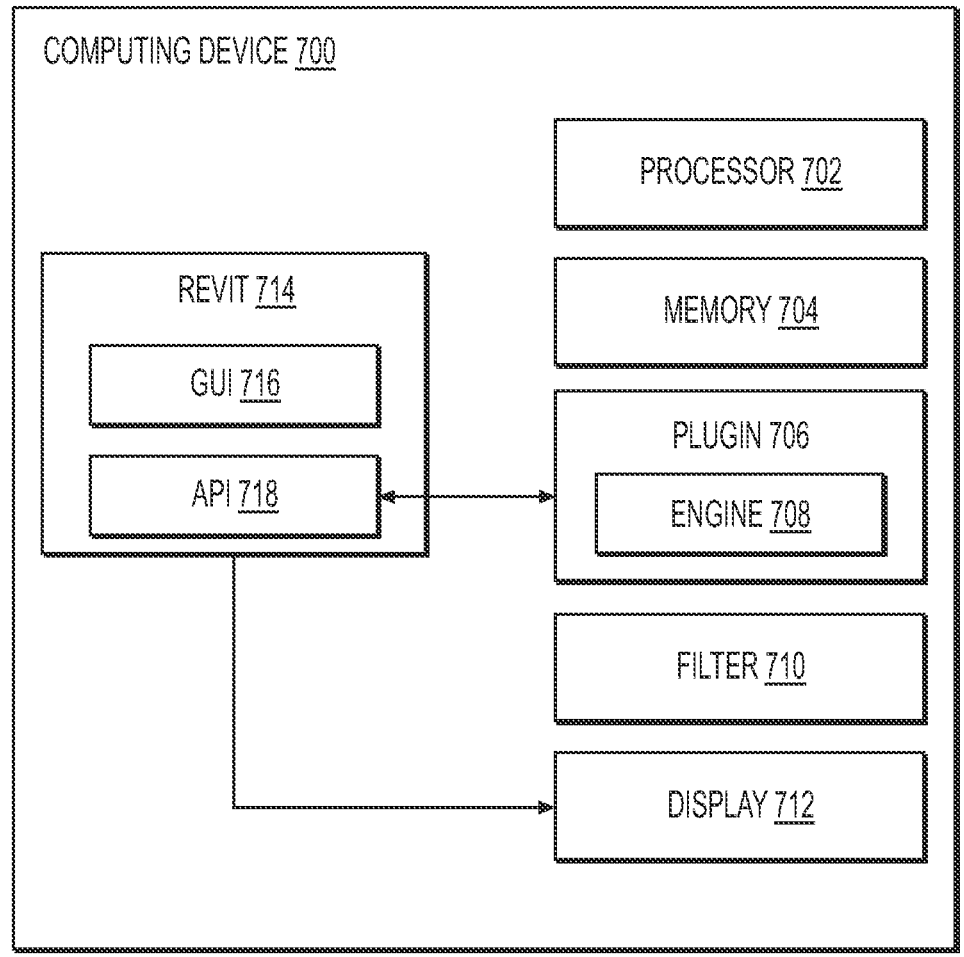
FIG. 7 is an illustration of a system for modifying elements in a CAD application using enhanced selection filtering.

FIG. 7 is an illustration of a system components for modifying elements in a CAD application using enhanced selection filtering. The computing device 700 can be any processor-based device, such as a personal computer, workstation, server, phone, or laptop. The computing device 700 can include a processor 702 and memory 704. The processor 702 can be one or more physical processors that are local to the computing device 700 or virtual computer processing units that are accessed remotely. The memory 704 can be non-transitory and can store instructions for execution by the processor 704.

The processor 702 can run a computer-aided design application, such as REVIT 714. Any CAD application can operate with the examples herein, but REVIT 714 is used as an example here. REVIT 714 can include a GUI 716 that executes to display a design layout and workspace for a user. The design layout can include parts and assemblies, all of which can be considered elements to which filters apply. The GUI can be generated on a display 712. The display 712 can be any type of screen and can be integrated into the computing device 700 or separate from the computing device 700.

REVIT 714 can utilize the plugin 706 to add functionality related to filtering searches and modifying elements and their parameters. The plugin 706 can make API 718 calls to REVIT 714 to integrate itself within the workflow. This can include altering the GUI 716 and providing additional functional items, such as menu items and buttons, for use with the auto-dimensioning. The plugin 706 can receive information, such as elements within a design layout, from REVIT 714, and send back information, such parameter changes based on rules executed by the plugin. The plugin 430 can also create an element modification window, in an example.

In one example, the plugin 706 creates and accesses filters 710 to determine what criteria to apply to elements within a design layout. The filters 710 can be keyed to part or assembly identifiers (e.g., specific element types) in an example. A database, either local or remote from the computing device 700, can store the filters 710 and be accessed by the plugin 706.

In one example, a selection engine 708 can perform the various stages performed by the plugin. The selection engine 708 can interpret the filter 710 conditions, compare against element parameters, and modify the parameters by executing an action of an associated rule for elements that meet the filter 710 conditions. For example, the selection engine 708 can identify elements that meet the filter criteria and perform actions like copying parameters, modifying parameters, executing macros, and changing work set parameters.

Although a plugin is described in some examples, the computer-aided application, such as REVIT, can alternatively build the described functionality directly into the application. The examples can still apply to that scenario as well. Additionally, though REVIT is referred to for convenience, the examples can also function with any other CAD application.

Other examples of the disclosure will be apparent to those skilled in the art from consideration of the specification and practice of the examples disclosed herein. Though some of the described methods have been presented as a series of steps, it should be appreciated that one or more steps can occur simultaneously, in an overlapping fashion, or in a different order. The order of steps presented are only illustrative of the possibilities and those steps can be executed or performed in any suitable fashion. Moreover, the various features of the examples described here are not mutually exclusive. Rather any feature of any example described here can be incorporated into any other suitable example. It is intended that the specification and examples be considered as exemplary only, with a true scope and spirit of the disclosure being indicated by the following claims.

What is claimed is:

1. A method for modifying elements of building components using a computer-aided design ("CAD") application, comprising:
    generating, with a selection engine, an element modification window within a graphical user interface ("GUI") of the CAD application, wherein the CAD application is executed by a physical processor, and wherein a plugin to the CAD application executes to provide the element modification window;
    receiving, by the plugin, criteria for a filter to apply to an element type in a design layout of the building components in the CAD application, the criteria being based on a parameter, operator, and operand;
    receiving, by the plugin, a selection of an action to perform on elements of the element type that meet the criteria on the filter, wherein the action is selected from a set of available actions that includes (1) setting a first element parameter to a value determined from a second element parameter, (2) executing a macro, and (3) setting a work set parameter;
    identifying at least one element in the design layout that fits the filter criteria; and
    performing the selected action on the at least one element, wherein the plugin makes an application programming interface ("API") call to the CAD application to specify the action and the at least one element,
    wherein the elements are of the building components and the element type refers to the type of an element of the building components.

2. The method of claim 1, further comprising:
    detecting a new element in the CAD application;
    determining whether the new element satisfies the criteria of the filter;
    in an instance where the new element satisfies the criteria of the filter, performing the selected action on the new element.

3. The method of claim 1, further comprising:
    receiving a selection for automatically performing the selected action based on the filter criteria;
    detecting a modification to an existing element in the CAD application;
    determining whether the existing element, after the modification, satisfies the criteria of the filter;
    in an instance where the existing element satisfies the criteria of the filter after the modification, performing the selected action on the existing element.

4. The method of claim 1, wherein setting a first element parameter to a value determined from a second element parameter comprises:
    receiving a selection of the second element parameter in a first field in the GUI;
    receiving a selection of the first element parameter in a second field of the GUI; and
    copying the value of the second element parameter to the first element parameter.

5. The method of claim 4, wherein the first and second element parameters are chosen from a list of parameters populated based on element types within the GUI, wherein common attributes of the element types are used to populate the parameter list.

6. The method of claim 4, wherein setting a first element parameter to a value determined from a second element parameter further comprises:
    receiving a script for modifying the value of the second element parameter;
    modifying the value using the script; and
    setting the modified value as the first element parameter.

7. The method of claim 6, wherein the value is a data object, and modifying the value includes performing a data object transformation.

8. A non-transitory, computer-readable medium containing instructions that, when executed by a hardware-based processor, performs stages for modifying elements of building components using a computer-aided design ("CAD") application, the stages comprising:
    generating, with a selection engine, an element modification window within a graphical user interface ("GUI") of the CAD application, wherein the CAD application is executed by a physical processor, and wherein a plugin to the CAD application executes to provide the element modification window;
    receiving, by the plugin, criteria for a filter to apply to an element type in a design layout of the building components in the CAD application, the criteria being based on a parameter, operator, and operand;
    receiving, by the plugin, a selection of an action to perform on elements of the element type that meet the criteria on the filter, wherein the action is selected from a set of available actions that includes (1) at least one of setting a first element parameter to a value determined from a second element parameter, (2) executing a macro, and (3) setting a work set parameter;

detecting a new element added to a design layout in the CAD application;

identifying at least one element in the design layout that fits the filter criteria; and performing the selected action on the at least one element, wherein the plugin makes an application programming interface ("API") call to the CAD application to specify the action and the at least one element, wherein the elements are of the building components and the element type refers to the type of an element of the building components.

9. The non-transitory, computer-readable medium of claim 8, the stages further comprising:

detecting a new element in the CAD application;

determining whether the new element satisfies the criteria of the filter;

in an instance where the new element satisfies the criteria of the filter, performing the selected action on the new element.

10. The non-transitory, computer-readable medium of claim 8, the stages further comprising:

receiving a selection for automatically performing the selected action based on the filter criteria;

detecting a modification to an existing element in the CAD application;

determining whether the existing element, after the modification, satisfies the criteria of the filter;

in an instance where the existing element satisfies the criteria of the filter after the modification, performing the selected action on the existing element.

11. The non-transitory, computer-readable medium of claim 8, wherein setting a first element parameter to a value determined from a second element parameter comprises:

receiving a selection of the second element parameter in a first field in the GUI;

receiving a selection of the first element parameter in a second field of the GUI; and copying the value of the second element parameter to the first element parameter.

12. The non-transitory, computer-readable medium of claim 11, wherein the first and second element parameters are chosen from a list of parameters populated based on element types within the GUI, wherein common attributes of the element types are used to populate the parameter list.

13. The non-transitory, computer-readable medium of claim 11, wherein setting a first element parameter to a value determined from a second element parameter further comprises:

receiving a script for modifying the value of the second element parameter;

modifying the value using the script; and setting the modified value as the first element parameter.

14. The non-transitory, computer-readable medium of claim 13, wherein the value is a data object, and modifying the value includes performing a data object transformation.

15. A system for modifying elements of building components using a computer-aided design ("CAD") application, comprising:

a memory storage including a non-transitory, computer-readable medium comprising instructions; and a computing device including a hardware-based processor that executes the instructions to carry out stages comprising:

generating, with a selection engine, an element modification window within a graphical user interface ("GUI") of the CAD application, wherein a plugin to the CAD application executes to provide the element modification window;

receiving, in the element modification window, criteria for a filter to apply to an element type of the building components in the CAD application, the criteria being based on a parameter, operator, and operand;

receiving, in the element modification window, a selection of an action to perform on elements of the element type that meet the criteria on the filter, wherein the action is selected from a set of available actions that includes (1) setting a first element parameter to a value determined from a second element parameter, (2) executing a macro, and (3) setting a work set parameter;

identifying at least one element in the design layout that fits the filter criteria; and performing the selected action on the at least one element, wherein the elements are of the building components and the element type refers to the type of an element of the building components, wherein the plugin makes an application programming interface ("API") call to the CAD application to specify the action and the at least one element.

16. The system of claim 15, the stages further comprising:

detecting a new element in the CAD application;

determining whether the new element satisfies the criteria of the filter;

in an instance where the new element satisfies the criteria of the filter, performing the selected action on the new element.

17. The system of claim 15, the stages further comprising:

receiving a selection for automatically performing the selected action based on the filter criteria;

detecting a modification to an existing element in the CAD application;

determining whether the existing element, after the modification, satisfies the criteria of the filter;

in an instance where the existing element satisfies the criteria of the filter after the modification, performing the selected action on the existing element.

18. The system of claim 15, wherein setting a first element parameter to a value determined from a second element parameter comprises:

receiving a selection of the second element parameter in a first field in the GUI;

receiving a selection of the first element parameter in a second field of the GUI; and copying the value of the second element parameter to the first element parameter.

19. The system of claim 18, wherein the first and second element parameters are chosen from a list of parameters populated based on element types within the GUI, wherein common attributes of the element types are used to populate the parameter list.

20. The system of claim 18, wherein setting a first element parameter to a value determined from a second element parameter further comprises:

receiving a script for modifying the value of the second element parameter;

modifying the value using the script; and setting the modified value as the first element parameter.

* * * * *